US012613149B2

(12) United States Patent
Mizuta

(10) Patent No.: US 12,613,149 B2
(45) Date of Patent: Apr. 28, 2026

(54) INTEGRATED STRAIN AND PIEZOELECTRIC SENSOR SYSTEM

(71) Applicant: Newport Sensors, Inc., Corona Del Mar, CA (US)

(72) Inventor: Masato Mizuta, New York, NY (US)

( * ) Notice: Subject to any disclaimer, the term of this patent is extended or adjusted under 35 U.S.C. 154(b) by 841 days.

(21) Appl. No.: 17/984,006

(22) Filed: Nov. 9, 2022

(65) Prior Publication Data

US 2024/0151596 A1 May 9, 2024

(51) Int. Cl.
| | |
|---|---|
| G01L 1/16 | (2006.01) |
| G01B 7/16 | (2006.01) |
| H10N 30/30 | (2023.01) |
| H10N 30/87 | (2023.01) |

(52) U.S. Cl.
CPC .................. G01L 1/16 (2013.01); G01B 7/16 (2013.01); H10N 30/302 (2023.02); H10N 30/875 (2023.02)

(58) Field of Classification Search
CPC .......... G01L 1/16; G01B 7/16; H10N 30/302; H10N 30/875
See application file for complete search history.

(56) References Cited

U.S. PATENT DOCUMENTS

2004/0159161 A1* 8/2004 Barnett .................. G01D 3/036
73/766
2023/0366707 A1* 11/2023 Tessema ............... B29C 70/885

* cited by examiner

*Primary Examiner* — J. San Martin

(57) ABSTRACT

Systems, devices, and methods for a dual-sensor apparatus (101), comprising: a conductive substrate (124); a piezoelectric material (126) disposed on the conductive substrate (124); and an electrically conductive trace (102) disposed on the piezoelectric material (126) in a strain gauge pattern, where the electrically conductive trace (102) comprises two leads; where the conductive substrate (124) and the electrically conductive trace (102) serve as electrodes for the piezoelectric material (126) to form a piezoelectric sensor; and where the electrically conductive trace (102) serves as a strain sensor.

20 Claims, 12 Drawing Sheets

400

402

404

406

408

410

412

422

420

418

416

414

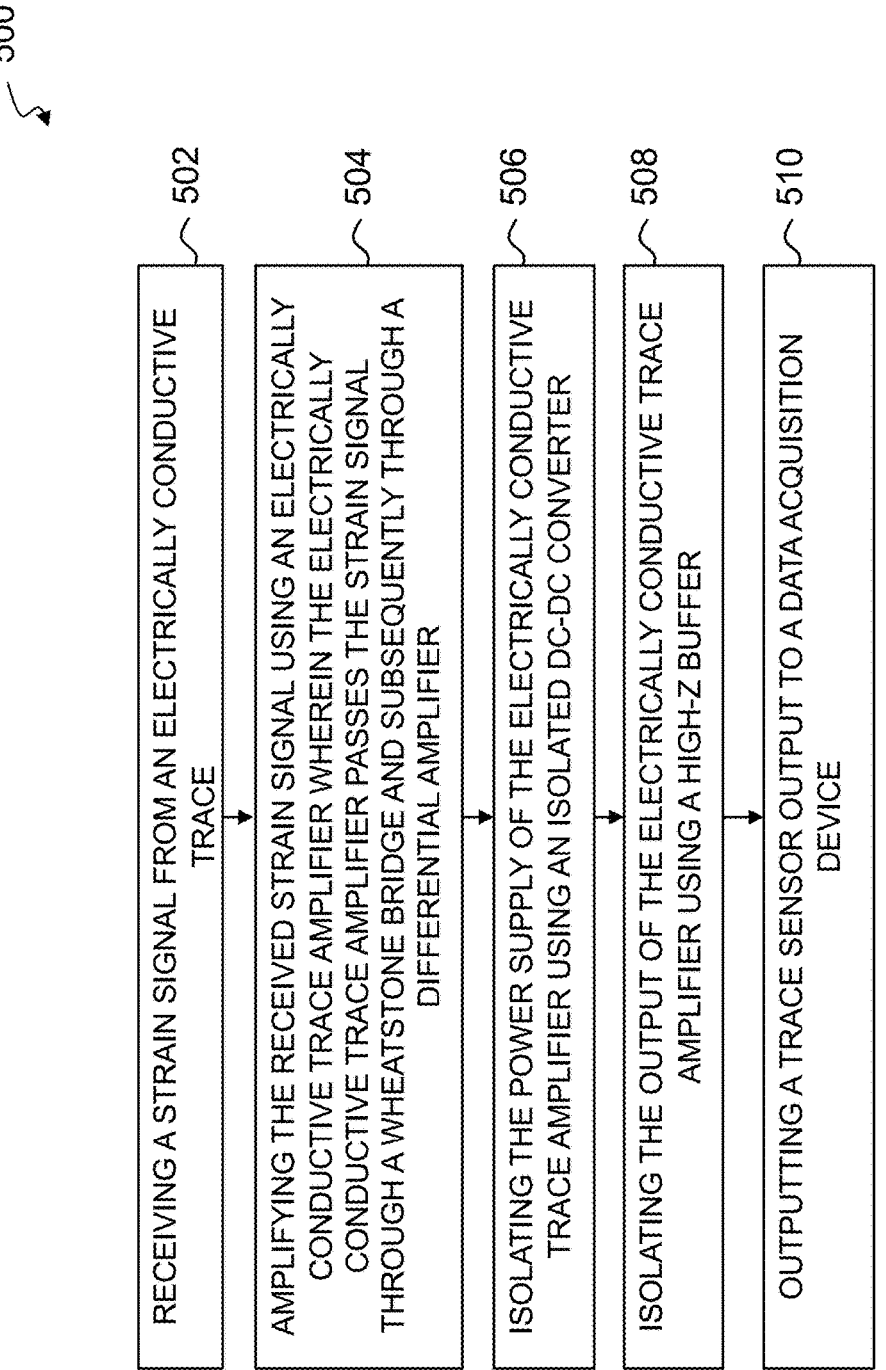

500

502

RECEIVING A STRAIN SIGNAL FROM AN ELECTRICALLY CONDUCTIVE TRACE

504

AMPLIFYING THE RECEIVED STRAIN SIGNAL USING AN ELECTRICALLY CONDUCTIVE TRACE AMPLIFIER WHEREIN THE ELECTRICALLY CONDUCTIVE TRACE AMPLIFIER PASSES THE STRAIN SIGNAL THROUGH A WHEATSTONE BRIDGE AND SUBSEQUENTLY THROUGH A DIFFERENTIAL AMPLIFIER

506

ISOLATING THE POWER SUPPLY OF THE ELECTRICALLY CONDUCTIVE TRACE AMPLIFIER USING AN ISOLATED DC-DC CONVERTER

508

ISOLATING THE OUTPUT OF THE ELECTRICALLY CONDUCTIVE TRACE AMPLIFIER USING A HIGH-Z BUFFER

510

OUTPUTTING A TRACE SENSOR OUTPUT TO A DATA ACQUISITION DEVICE

FIG. 5

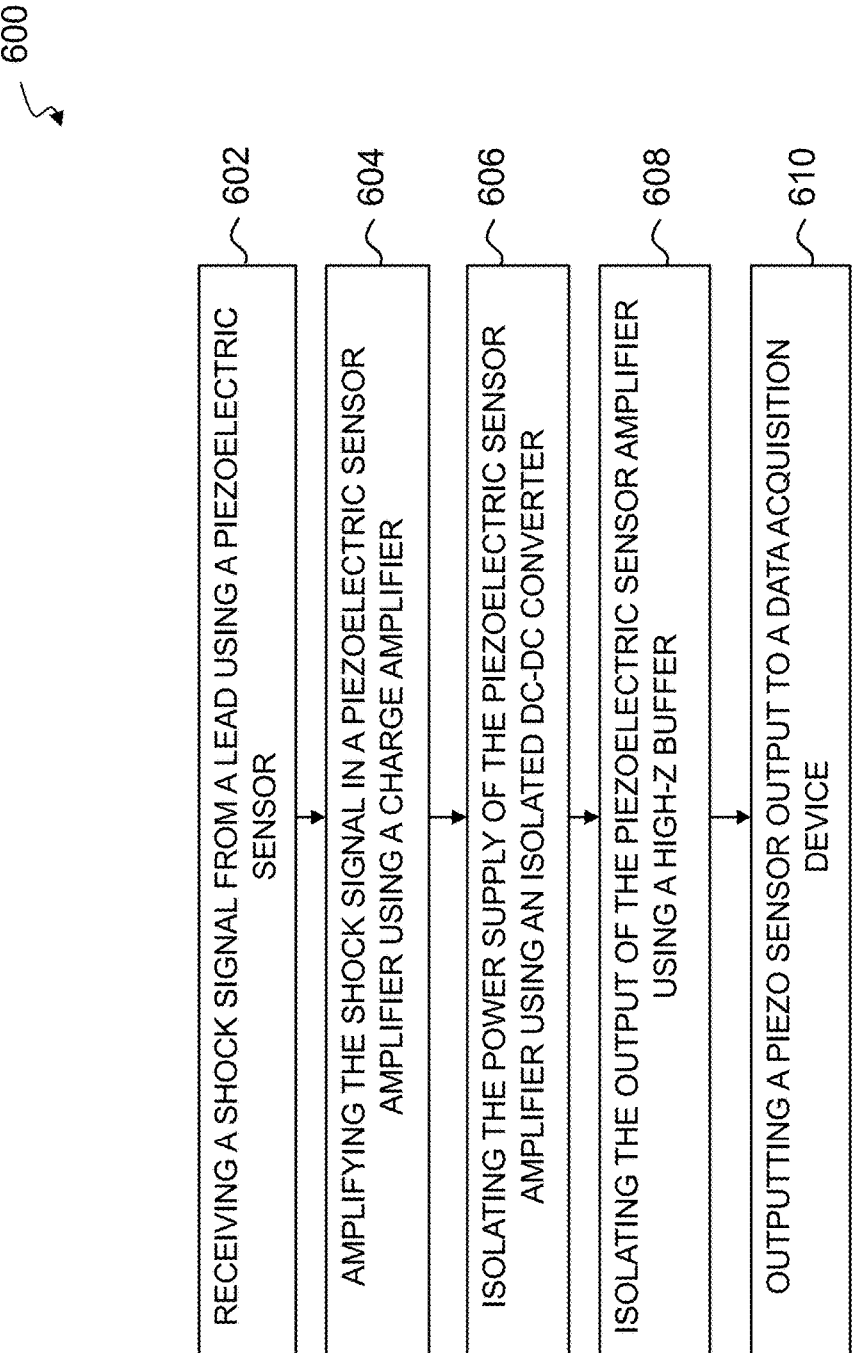

600

602 — RECEIVING A SHOCK SIGNAL FROM A LEAD USING A PIEZOELECTRIC SENSOR

604 — AMPLIFYING THE SHOCK SIGNAL IN A PIEZOELECTRIC SENSOR AMPLIFIER USING A CHARGE AMPLIFIER

606 — ISOLATING THE POWER SUPPLY OF THE PIEZOELECTRIC SENSOR AMPLIFIER USING AN ISOLATED DC-DC CONVERTER

608 — ISOLATING THE OUTPUT OF THE PIEZOELECTRIC SENSOR AMPLIFIER USING A HIGH-Z BUFFER

610 — OUTPUTTING A PIEZO SENSOR OUTPUT TO A DATA ACQUISITION DEVICE

INTEGRATED STRAIN AND PIEZOELECTRIC SENSOR SYSTEM

FIELD OF ENDEAVOR

The invention relates generally to structural health monitoring and damage detection, and more particularly to sensors using piezoelectric material integrated with electrically conductive material.

BACKGROUND

Structures as well as electronic and electromechanical systems, such as automotive vehicles and aircrafts, are often subjected to vibration and shock, which tend to shorten the life of these systems and make them susceptible to intermittent and catastrophic failure. Methods of measuring an integrity of a structure include non-destructive evaluation techniques, such as ultrasonics, infrared, and X-ray imaging. Techniques such as these can be costly, time consuming, and often only provide an understanding of a structure's health at finite intervals or times. For example, if one wanted to conduct a measure of a structures health using an X-ray imaging device, a process may include disassembling or disconnecting a structure from a system, relocating the structure to a location where an X-ray machine resides, setting and X-ray machine up for imaging of a desired location on the structure, and executing an imaging process. This process may further comprise removing the structure from the X-ray machine, relocating it back to its original location, and reassembling and/or connecting the structure to a system. A process such as this would be time-consuming, labor intensive, and may incur costs of a system being down while conducting the structural inspection. Such non-destructive evaluation methods cannot be used for continuous monitoring for timely damage detection.

SUMMARY

In one embodiment, a dual-sensor apparatus may include: a conductive substrate; a piezoelectric material disposed on the conductive substrate; and an electrically conductive trace disposed on the piezoelectric material in a strain gauge pattern, where the electrically conductive trace comprises two leads; where the conductive substrate and the electrically conductive trace serve as electrodes for the piezoelectric material to form a piezoelectric sensor; and where the electrically conductive trace serves as a strain sensor.

In additional dual-sensor apparatus embodiments, the dual-sensor apparatus may be attached to a structural surface for structural damage detection and health monitoring. Additional dual-sensor apparatus embodiments may further include: a conductive trance sensor amplifier; an electrically conductive trace current loop formed between the electrically conductive trace and the conductive trance sensor amplifier through the two leads of the electrically conductive trace; a charge amplifier; a piezoelectric current loop formed between the sensor apparatus and a sensor amplifier through two connections between the electrically conductive trace and the electrically conductive trace sensor amplifier, and between the conductive substrate and the charge amplifier; where the piezoelectric current loop, the connection between the conductive substrate and the charge amplifier may be connected to a ground, where the conductive trance sensor amplifier may be configured to measure a strain on a surface connected to the conductive substrate using the electrically conductive trace current loop generated by a resistance change of the electrically conductive trace; and where the charge amplifier may be configured to measure an impact shock on a surface connected to the conductive substrate using the piezoelectric current loop generated by the piezoelectric material.

Additional dual-sensor apparatus embodiments may further include: a high input impedance buffer connected to the conductive trance sensor amplifier; a high input impedance buffer connected to the piezoelectric sensor amplifier; where the high input impedance buffer may be configured to isolate an output of the conductive trance sensor amplifier to prevent a current flow to the ground; and where the high input impedance buffer may be configured to isolate an output of the piezoelectric sensor amplifier to prevent the current flow to the ground. In additional dual-sensor apparatus embodiments, said conductive substrate may be the surface of the structure to be monitored.

A segmented dual-sensor apparatus embodiment may include: a conductive substrate; a piezoelectric material disposed on the conductive substrate; and a plurality of electrically conductive traces disposed on portions of the piezoelectric material in respective strain gauge patterns, where each electrically conductive trace comprises two leads, where the conductive substrate and the plurality of electrically conductive traces serve as electrodes for the piezoelectric material to form a plurality of piezoelectric sensors; and where the plurality of electrically conductive traces serve as a plurality of strain sensors.

In additional segmented dual-sensor apparatus embodiments, the segmented dual-sensor apparatus may be attached to a structural surface for structural damage detection, damage location identification, and structural health monitoring.

Additional segmented dual-sensor apparatus embodiments may further include: a plurality of conductive trance sensor amplifiers; a plurality of electrically conductive trace current loops formed between the sensor apparatus and a respective sensor amplifier of the plurality of sensor amplifiers through the respective two leads of each electrically conductive trace; a plurality of piezoelectric current loops formed between the sensor apparatus and a respective sensor amplifier of the plurality of sensor amplifiers through the respective two leads of each electrically conductive trace and the conductive substrate; where the plurality of the piezoelectric current loops, the connection between the conductive substrate and a respective sensor amplifier of the plurality of sensor amplifiers may be connected to a ground; where the plurality of sensor amplifiers may be configured to measure a strain on portions of a surface connected to the conductive substrate using a respective conductive current loop of the plurality of the electrically conductive trace current loops; and where the plurality of sensor amplifiers may be configured to measure an impact shock on portions of a surface connected to the conductive substrate using a respective piezoelectric current loop of the plurality of the piezoelectric current loops.

Additional segmented dual-sensor apparatus embodiments may further include: a plurality of output buffers connected to a respective sensor amplifier of the plurality of sensor amplifiers; and where the plurality of output buffers may be configured to isolate a plurality of outputs of the sensor amplifiers to prevent the current flow to the ground. In additional segmented dual-sensor apparatus embodiments, said conductive substrate may be the surface of the structure to be monitored.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which:

FIG. 5 depicts a high-level flowchart of a method of receiving and amplifying a strain signal comprising one of two simultaneous electrically conductive trace and piezoelectric sensor amplifier circuit signals, according to one embodiment;

FIG. 6 depicts a high-level flowchart of a method of receiving and amplifying a shock signal comprising one of two simultaneous electrically conductive trace and piezoelectric sensor amplifier circuit signals, according to one embodiment;

DETAILED DESCRIPTION

The following description is made for the purpose of illustrating the general principles of the embodiments discloses herein and is not meant to limit the concepts disclosed herein. Further, particular features described herein can be used in combination with other described features in each of the various possible combinations and permutations. Unless otherwise specifically defined herein, all terms are to be given their broadest possible interpretation including meanings implied from the description as well as meanings understood by those skilled in the art and/or as defined in dictionaries, treatises, etc.

The present system allows for the measurement of an impact force on a structure or structures, structural surface strains, as well as the detection of structural damage using simultaneous measurement by the integrated piezoelectric sensors and electrically conductive trace sensors, to allow a singular system to provide accurate, continuous, granular, and reliable monitoring results. The disclosed dual-sensor system provides a cost and time effective method for continuous monitoring and assessing structural health and timely detection of structural damage to ensure structural integrity. Having the ability to monitor structural health is advantageous to a user and/or owner of a structure because it provides real-time insight into the integrity, safety, and potential failure of the structure.

The present system includes two integrated sensors: (1) A piezoelectric sensor that measures impact forces applied to the piezoelectric material by measuring the electrical charges generated by the piezoelectric material in response to the impact forces. The piezoelectric sensor can also detect, in real time, initiation of structural damage such as cracking and composite fiber breakage, because such damage events generate mechanical stress and electrical charges in the piezoelectric material. (2) A strain sensor using the electrically conductive trace (that also serve as the electrodes of the piezoelectric sensor) that measures structural strain. The electrical resistance of the trace increases as the structural strain increases. Therefore, by measuring the resistance, the structural strain is monitored. Excessive strain is an indication of structural damage. It is possible to set up a resistance threshold for damage early warning.

Figure 1A:
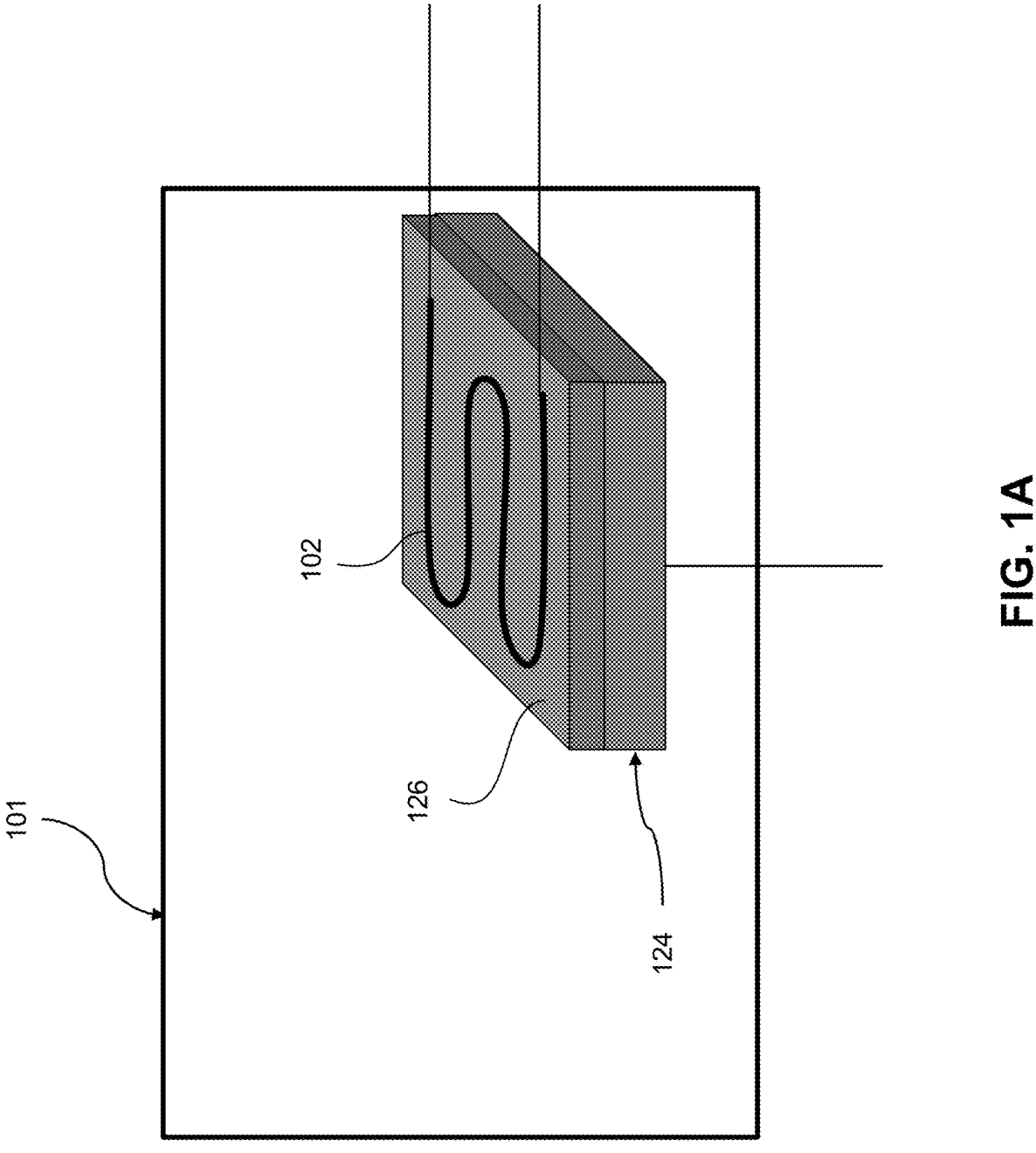
FIG. 1A depicts a high-level block diagram of a dual-sensor apparatus, according to one embodiment.

Methods of structural health monitoring in prior art include the use of electric conductivity of a structural material (such as carbon fibers). These methods measure an electrical resistance across a material in relation to a change in a strain, but they may be difficult to implement due to difficulties in insulating electrical currents in a sensor material. Furthermore, methods such as these may not be effective in detecting dynamic impact loads and structural damage initiation due to sensitivity of a measured change in electrical resistance. By simultaneously measuring both dynamic signals such as the impact force and structural damage initiation and static signals such as structural strain, the disclosed dual-sensor system provides high sensitivity, redundancy, and reliability in real-time detection of impact force and structural damage FIG. 1A depicts a high-level block diagram of a dual-sensor apparatus 101, according to one embodiment. The dual-sensor apparatus 101 includes an electrically conductive trace 102 (e.g., metal foil, metal wire, conductive paint) on a surface of the piezoelectric material 126, opposite the surface shared with a conductive substrate 124, the electrically conductive trace 102 and the conductive substrate 124 may be utilized as the electrodes to create a piezoelectric sensor, while the electrically conductive trace 102 can be used to create a strain sensor. The integrated sensor can be affixed to the surface of a structure to monitor the structural surface strain, impact loads on the structure, and damage initiation in the structure.

Figure 1B:
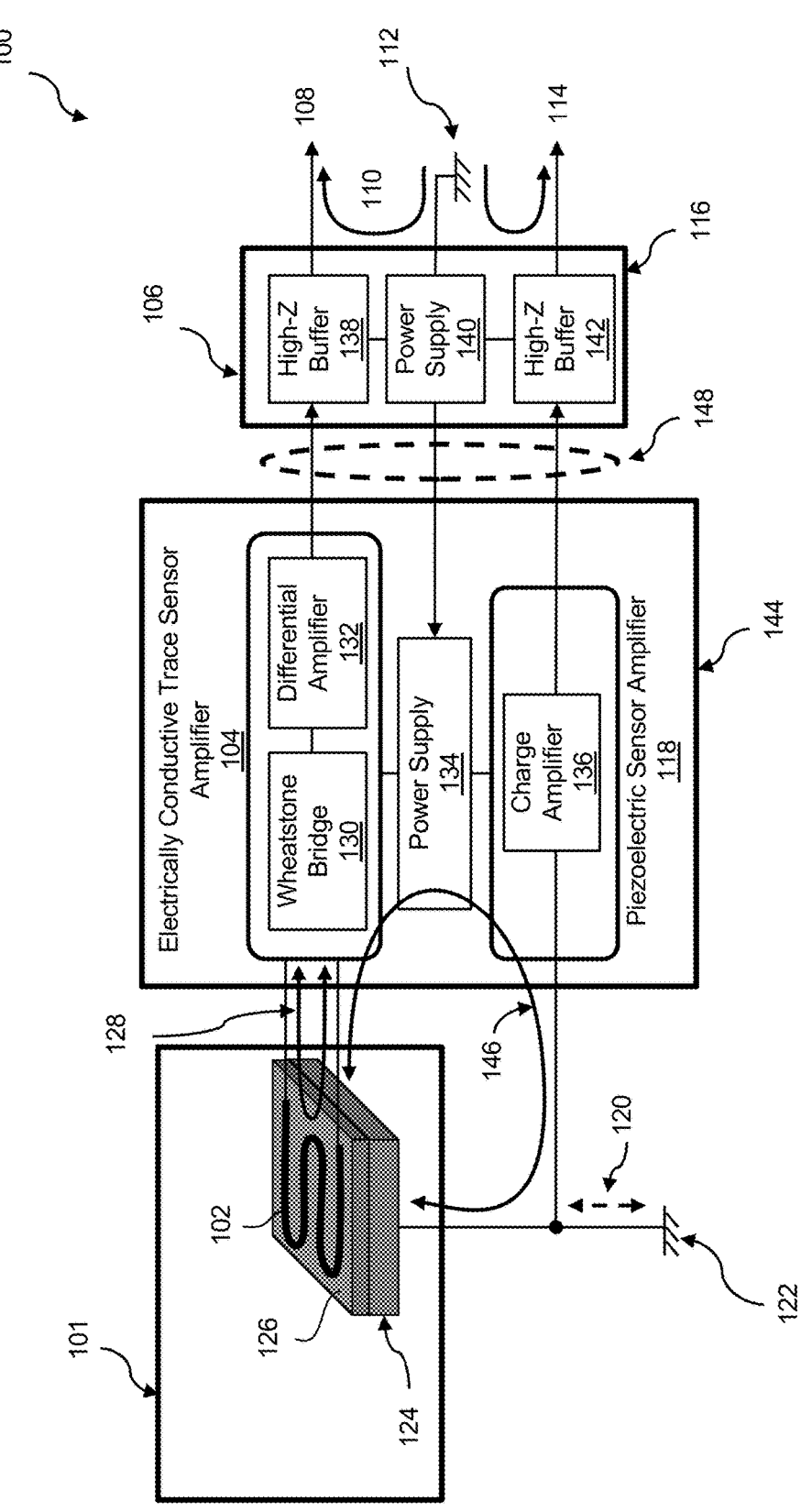
FIG. 1B depicts a high-level block diagram of a simultaneous electrically conductive trace and piezoelectric sensor amplifier circuit for a single element, according to one embodiment.

FIG. 1B depicts a high-level block diagram of a simultaneous electrically conductive trace and piezoelectric sensor amplifier circuit for a single element system 100, according to one embodiment. Stresses, such as shock and vibration, can affect a wide variety of structures including electronics as well as components making up air-worthy equipment and parts. Some environments such as in aerial flight, see continual stresses imposed on them from turbulence or other phases of flight, such as takeoff and landing. An airplane's wing for example, must absorb millions of instances of flex and shock over the course of service. Other more sensitive components within an airplane, such as electronics, must also endure a similar number of instances of shock and vibration. Being able to understand the health of a wing is critical in determining an airplanes airworthiness as well as to plan maintenance and/or predict failure.

Similarly, electronic pieces of equipment which are sensitive to shock require regular testing to ensure the functionality of the equipment. The ability to test and measure the integrity of a critical piece of equipment is invaluable. As there are multiple methods of measuring the integrity of a structures health it would be beneficial to i) use multiple methods during a testing period to ensure an accurate understanding of a structures health, and ii) collect a multitude of continuous structural health data points to have an up-to-date measure of the condition of a structure's health. The disclosed system 100 provides the ability to simultaneously measure a structures integrity using multiple methods of measurement, including an electrically conductive trace current loop 128 and a piezoelectric current loop 146, as well as provide continuous data points of those measurements.

In an embodiment depicted in FIG. 1B, a conductive substrate 124 surface (e.g., metal, carbon fiber, CFRP), shares a surface with a piezoelectric material 126 (e.g., PVDF, PZT, and quarts). By creating a strain gauge pattern in the dual-sensor apparatus 101 using an electrically conductive trace 102 (e.g., metal foil, metal wire, conductive paint) on a surface of the piezoelectric material 126, opposite the surface shared with a conductive substrate 124, the electrically conductive trace 102 and the conductive substrate 124 may be utilized as the electrodes to create a piezoelectric sensor, while the electrically conductive trace 102 can be used to create a strain sensor. The integrated sensor can be affixed to the surface of a structure to monitor the structural surface strain, impact loads on the structure, and damage initiation in the structure.

In this embodiment the structural surface is electrically conductive allowing for an electrical current to create a piezoelectric current loop 146 between the two leads of the electrically conductive trace 102 and the conductive substrate 124. In other embodiments where a structural surface is of a non-conductive material, a conductive substrate is added between the piezoelectric material 126 and a structural surface to create the piezoelectric current loop 146. This configuration creates two loops, an electrically conductive trace current loop 128 between the two leads of the electrically conductive trace 102 and two inputs of a conductive trance sensor amplifier 104, and the piezoelectric current loop 146 comprising a ground 122 grounding the conductive substrate 124, a lead extending from the ground 122 to an input of a charge amplifier 136, and one of two leads extending from the electrically conductive trace 102 entering a Wheatstone bridge 130 of the electrically conductive trace sensor amplifier 104. The two loops may be used as circuits to measure strain (by the electrically conductive trace current loop 128) and impact shock (by the piezoelectric current loop 146).

Signals leading from the loops 146, 128 may be received by sensor amplifier 144, where the sensor amplifiers comprise of an electrically conductive trace sensor amplifier 104, a piezoelectric sensor amplifier 118, and a power supply 134. Leads creating the electrically conductive trace current loop 128, or the strain signal, may be amplified by first entering the Wheatstone bridge 130 of the electrically conductive trace sensor amplifier 104. The strain signal may then continue to a differential amplifier 132 prior to exiting the sensor amplifier 144. The impact shock signal created using the piezoelectric current loop 146 may be amplified by sensor amplifier 144 by first entering a piezoelectric sensor amplifier 118 which comprises a charge amplifier 136. The shock impact signal may then exit the sensor amplifier 144 as outputs. To combine the two amplified signals (the strain signal and the shock signal), the sensor amplifier 144 outputs are isolated 148 using high input impedance buffers or output buffers 116. A power supply powering the sensor amplifier 144 may also be isolated 148 using an isolated power supply 140. This isolated design embodiment only allows the current generated by the piezoelectric charge, measurable in the piezoelectric current loop 146, to go through the charge amplifier 136. This embodiment allows the charge amplifier 136 to accurately convert the piezoelectric charge, of piezoelectric current loop 146, to a voltage without being affected by the electrically conductive trace sensor amplifier 104 and the receiver of the outputs such as a data acquisition (DAQ) device (not depicted). The isolated strain signal may enter a high-z buffer 138 prior to being received by a DAQ as a trance sensor output 108. Similarly, the isolated shock signal, upon exiting the piezoelectric sensor amplifier 118 of the sensor amplifier 144 may enter a high-Z buffer 142 and subsequently be received by a DAQ as a piezo sensor output 114. The DAQ may use output current loops 110 created by the piezo sensor output 114, the trace sensor output 108, and a ground 112 of a power supply 140.

A dual-sensor apparatus 101 may include: a conductive substrate 124; a piezoelectric material 126 disposed on the conductive substrate 124; and an electrically conductive trace 102 disposed on the piezoelectric material 126 in a strain gauge pattern, where the electrically conductive trace 102 comprises two leads; where the conductive substrate 124 and the electrically conductive trace 102 serve as electrodes for the piezoelectric material 126 to form a piezoelectric sensor; and where the electrically conductive trace 102 serves as a strain sensor.

In additional dual-sensor apparatus 101 embodiments, the dual-sensor apparatus 101 may be attached to a structural surface for structural damage detection and health monitoring. Additional dual-sensor apparatus 101 embodiments may further include: a conductive trance sensor amplifier 104; an electrically conductive trace current loop 128 formed between the electrically conductive trace 102 and the conductive trance sensor amplifier 104 through the two leads of the electrically conductive trace 102; a charge amplifier 136; a piezoelectric current loop 146 formed between the sensor apparatus 101 and a sensor amplifier 144 through two connections between the electrically conductive trace 102 and the electrically conductive trace sensor amplifier 104, and between the conductive substrate 124 and the charge amplifier 136; where the piezoelectric current loop 146, the connection between the conductive substrate 124 and the charge amplifier 136 may be connected to a ground 122, where the conductive trance sensor amplifier 104 may be configured to measure a strain on a surface connected to the conductive substrate 124 using the electrically conductive trace current loop 128 generated by a resistance change of the electrically conductive trace 102; and where the charge amplifier 136 may be configured to measure an impact shock on a surface connected to the conductive substrate 124 using the piezoelectric current loop 146 generated by the piezoelectric material 126.

Additional dual-sensor apparatus 101 embodiments may further include: a high input impedance buffer 138 connected to the conductive trance sensor amplifier 104; a high input impedance buffer 142 connected to the piezoelectric sensor amplifier 104; where the high input impedance buffer 138 may be configured to isolate an output of the conductive trance sensor amplifier 104 to prevent a current flow 120 to the ground 122; and where the high input impedance buffer 142 may be configured to isolate an output of the piezoelectric sensor amplifier 118 to prevent the current flow 120 to the ground 122. In additional dual-sensor apparatus 101 embodiments, said conductive substrate 124 may be the surface of the structure to be monitored.

Figure 2:
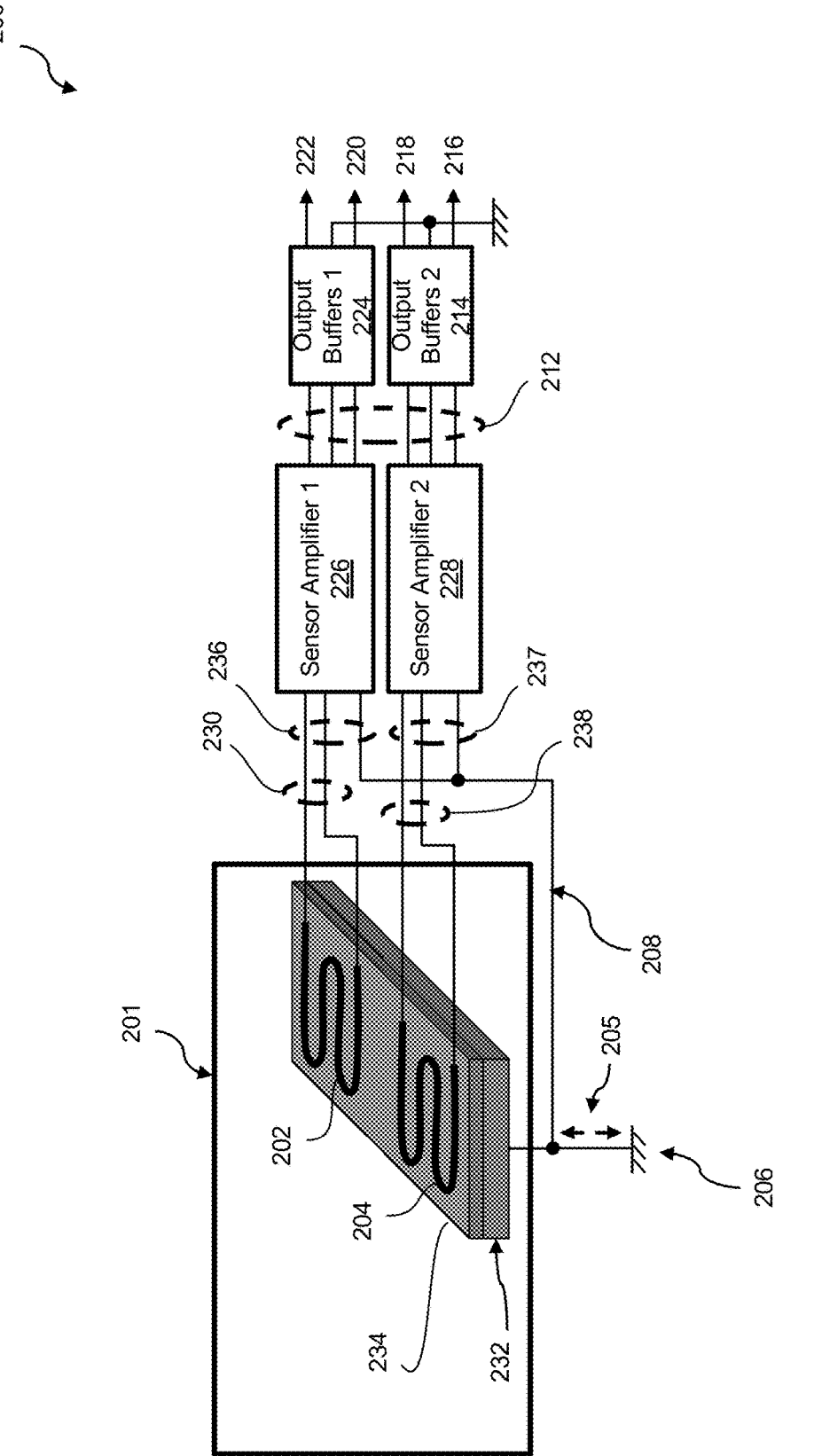
FIG. 2 depicts a high-level block diagram of a simultaneous electrically conductive trace and piezoelectric sensor amplifier circuit for multiple elements, according to one embodiment.

FIG. 2 depicts a high-level block diagram of a simultaneous electrically conductive trace and piezoelectric sensor amplifier circuit for a multiple element system 200, according to one embodiment. The system 200 may be used in situations where multiple locations of a structure require simultaneous and continuous shock and strain measuring. The system 200 depicts an embodiment where this measurement requirement is fulfilled comprising a plurality of electrically conductive traces 202, 204 which illustrate a system where the plurality of electrically conductive traces 202, 204 are located at different locations on a structure. Similar to the embodiment depicted in FIG. 1B, the electrically conductive traces 202, 204 reside substantially on a surface of a piezoelectric material 234 creating a strain gauge pattern opposite a surface of the piezoelectric material 234 which may abut a conductive substrate 232.

In other embodiments where a structural surface (not depicted) is of a non-conductive material, a conductive substrate 232 may be added between the piezoelectric material 234 and the structural surface to create the piezoelectric current loop 236 for electrically conductive trace 1 202, and a second piezo electric current loop (237) for electrically conductive trace 2 204.

By using strain gauge patterns created by electrically conductive traces 202, 204 on a surface of the piezoelectric material 234, electrically conductive trace current loops 230 and 238 create a signal capable of measuring a strain within a conductive substrate 232. A piezoelectric current loop 236 created between a lead 208 extending from a ground 206 from conductive substrate 232, and leads extending from electrically conductive trace 1 202 and/or electrically conductive trace 2 204 may be used to create a shock sensor. The integrated sensor can be affixed to the surface of a structure to monitor the structural surface strain, impact loads on the structure, and damage initiation in the structure.

In this embodiment the structural surface is electrically conductive allowing for an electrical current to create piezoelectric current loops 230, 238 between the leads of electrically conductive traces 202 and 204 and the conductive substrate 232. In other embodiments where a structural surface is of a non-conductive material, a conductive substrate is added between the piezoelectric material 234 and the structural surface to create piezoelectric current loops 236 (and a second loop not depicted). This configuration creates multiple loops comprising: electrically conductive trace current loops 230, 238 between the two leads of the electrically conductive traces 202, 204 and two inputs of conductive trance sensor amplifiers 226, 228; and piezoelectric current loops 236 (and a second loop not depicted) comprising a ground 206 grounding a conductive substrate 232, a lead extending from the ground 208 to an input of the electrically conductive trace sensor amplifier 1 226 and electrically conductive trace sensor amplifier 2 228, and one of two leads extending from electrically conductive traces 202, 204 entering the electrically conductive trace sensor amplifier 1 226 and electrically conductive trace sensor amplifier 2 228. The loops 230, 238, 236 may be used as circuits to measure strain consecutively.

Signals created by the loops 230, 238, 236 may be received by electrically conductive trace sensor amplifier 1 226 and electrically conductive trace sensor amplifier 2 (228, where the electrically conductive trace sensor amplifier 1 226 and electrically conductive trace sensor amplifier

2 228 comprise components described in FIG. 1B. Similar to that which is described in FIG. 1B, those signals leading from electrically conductive trace 1 202 and electrically conductive trace 2 204 are amplified in electrically conductive trace sensor amplifier 1 202 and electrically conductive trace sensor amplifier 2 204, isolated 212, enter output buffer 1 224 and output buffer 2 214, and exit the system 200 as trace sensor output 1 222, trace sensor output 2 218, and piezo sensor output 1 220 and piezo sensor output 2 216. A DAQ (not depicted) can then receive these signals for further analysis and recording. In some embodiments, a single piezoelectric layer may be used in combination with multiple conductive substrates.

In some embodiments, piezoelectric material may be used as resin matrix for composite materials. In some embodiments, various patterns may be dependent on the structure surface contour. In some embodiments, the strain gauge pattern may be optimized for the surface contour. One example embodiment may include a composite vehicle bumper beam made of a carbon fiber shell. The use of multiple traces may allow for more accurate identification of a damage location. In some embodiments, an average strain signal may be obtained by using one large single trace. One embodiment may include analog to digital signal converters where threshold values are used for digital signal values where each value has a significance such as, e.g., "low", "moderate", "high/critical". In one embodiment, analog strain and shock value ranges may be used where output values represent ranges concerning a strain or impact force value.

A segmented dual-sensor apparatus 201 may include: a conductive substrate 232; a piezoelectric material 234 disposed on the conductive substrate 232; and a plurality of electrically conductive traces 202, 204 disposed on portions of the piezoelectric material 234 in respective strain gauge patterns, where each electrically conductive trace 202, 204 comprises two leads, where the conductive substrate 232 and the plurality of electrically conductive traces 202, 204 serve as electrodes for the piezoelectric material 234 to form a plurality of piezoelectric sensors; and where the plurality of electrically conductive traces 202, 204 serve as a plurality of strain sensors.

In additional segmented dual-sensor apparatus 201 embodiments, the segmented dual-sensor apparatus 201 may be attached to a structural surface for structural damage detection, damage location identification, and structural health monitoring. Additional segmented dual-sensor apparatus 201 embodiments may further include: a plurality of conductive trance sensor amplifiers 226, 228; a plurality of electrically conductive trace current loops 230, 238 formed between the sensor apparatus 201 and a respective sensor amplifier of the plurality of sensor amplifiers 226, 228 through the respective two leads of each electrically conductive trace 202, 204; a plurality of piezoelectric current loops 236, 237 formed between the sensor apparatus 201 and a respective sensor amplifier 226, 228 of the plurality of sensor amplifiers 226, 228 through the respective two leads of each electrically conductive trace 202, 204 and the conductive substrate 232; where the plurality of the piezoelectric current loops 236, 237, the connection between the conductive substrate 232 and a respective sensor amplifier 226, 228 of the plurality of sensor amplifiers 226, 228 may be connected to a ground 206; where the plurality of sensor amplifiers 226, 228 may be configured to measure a strain on portions of a surface connected to the conductive substrate 232 using a respective conductive current loop 230, 238 of the plurality of the electrically conductive trace current loops 230, 238; and where the plurality of sensor amplifiers 226, 228 may be configured to measure an impact shock on portions of a surface connected to the conductive substrate 232 using a respective piezoelectric current loop 236, 237 of the plurality of the piezoelectric current loops 236, 237.

Additional segmented dual-sensor apparatus 201 embodiments may further include: a plurality of output buffers 224, 214 connected to a respective sensor amplifier 226, 228 of the plurality of sensor amplifiers 226, 228; and where the plurality of output buffers 224, 214 may be configured to isolate a plurality of outputs of the sensor amplifiers 224, 214 to prevent the current flow 205 to the ground 206. In additional segmented dual-sensor apparatus 201 embodiments, said conductive substrate 232 may be the surface of the structure to be monitored.

Figure 3:
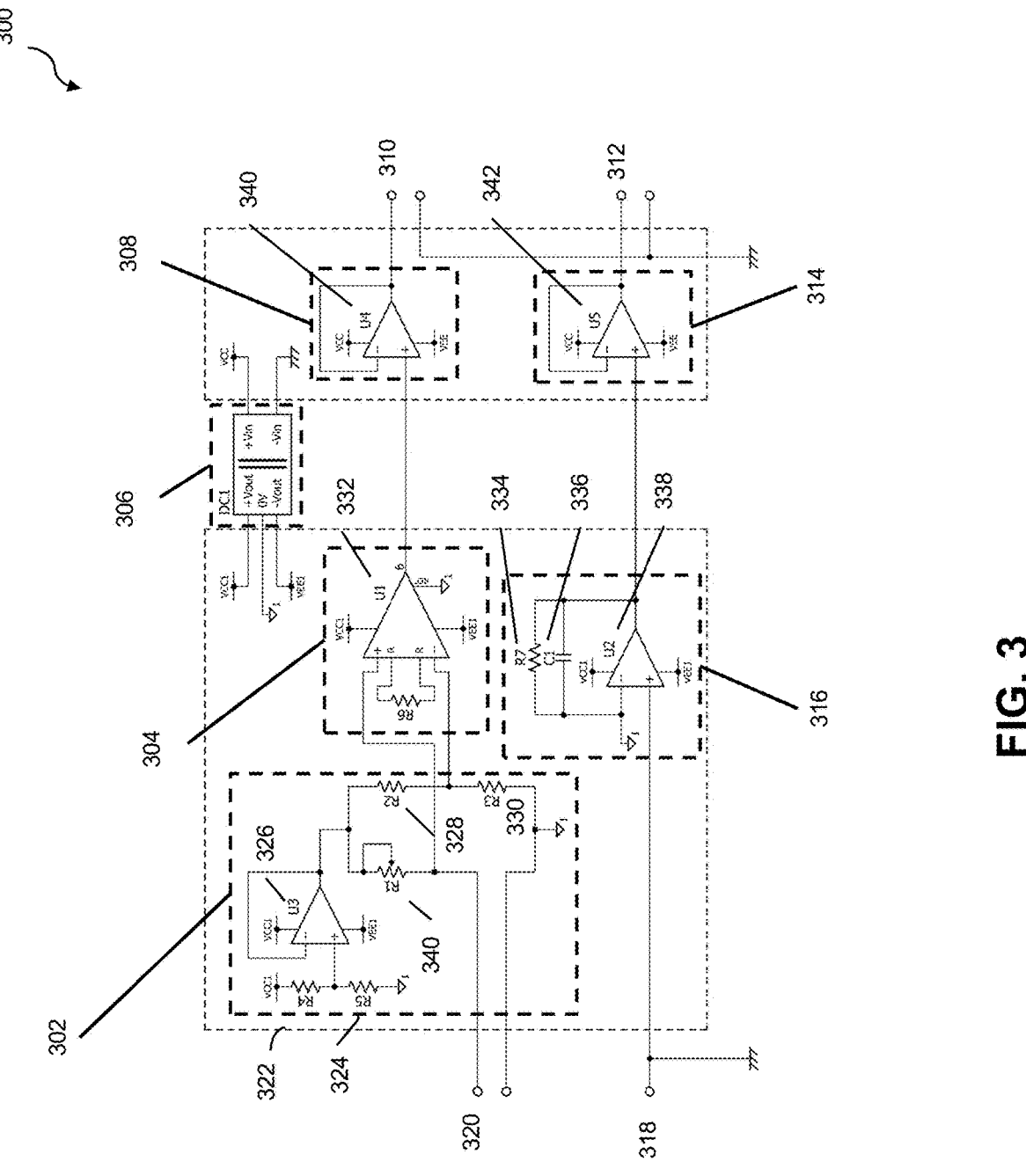
FIG. 3 depicts a schematic of a sensor amplifier circuit for a single element, according to one embodiment.

FIG. 3 depicts a schematic of a sensor amplifier circuit for a single element system 300, according to one embodiment. System 300 may comprise: a Wheatstone bridge 302, where the Wheatstone bridge comprises: a resisters R1 340, R2 328, and R3 330; and resisters R4 322, R5 324, and U3 326 which provide power to the Wheatstone bridge 302. System 300 may further comprise: a differential amplifier 304, where the differential amplifier 304 comprises an instrumentation amplifier U1 332; a charge amplifier 316, where the charge amplifier 316 comprises: an operational amplifier U2 338, a resister R7 334, and a capacitor C1 336; high-Z buffers 308, 314, where the high-Z buffers comprise high impedance amplifiers U4 340, U5 342 consecutively; a power supply for sensor amplifiers DC1 306, where the power supply for sensor amplifiers DC1 306 isolates the power supply to the sensor amplifier circuit 300; a trace sensor output 310; and a piezo sensor output 312.

Figure 4:
FIG. 4 depicts a schematic of a sensor amplifier circuit for multiple elements, according to one embodiment.

FIG. 4 depicts a schematic of a sensor amplifier circuit for multiple elements system 400, according to one embodiment. System 400 may use similar circuitry depicted in FIG. 3 where according to the embodiment multiple electrically conductive traces 1, 3 (422, 418) enter sensor amplifiers 1 420, and 2 414. Circuitry which comprise sensor amplifiers 1 and 2 (420, 414) may be significantly identical to each other and the circuitry described in FIG. 3's sensor amplifier system 300, where sensor amplifiers 1 420, and 2 414 also comprise output buffers 1 402, and 2 408 consecutively as well as at least two outputs, where the at least two sensor outputs comprise a trace sensor output 1 404 and a piezo sensor output 1 406, for the sensor amplifier 1 420 and corresponding at least two outputs for sensor amplifier 2 414, where the at least two sensor outputs comprise a trace sensor output 2 410 and a piezo sensor output 2 412. The sensor amplifier circuit may also receive an input from the conductive substrate 416.

FIG. 5 depicts a high-level flowchart of a method 500 of receiving and amplifying a strain signal comprising one of two simultaneous electrically conductive trace and piezoelectric sensor amplifier circuit signals, according to one embodiment. The method 500 may comprise receiving a strain signal from an electrically conductive trace (step 502). The method 500 may then comprise Amplifying the received strain signal using an electrically conductive trace amplifier wherein the electrically conductive trace amplifier passes the strain signal through a Wheatstone bridge and subsequently through a differential amplifier (step 504). The method 500 may further comprise isolating the power supply of the electrically conductive trace amplifier using an isolated DC-DC converter (step 506). The method 500 may additionally comprise isolating the output of the electrically conductive trace amplifier using a high-z buffer (step 508).

The method may lastly comprise outputting a trace sensor output to a data acquisition device (step 510).

FIG. 6 depicts a high-level flowchart of a method 500 of receiving and amplifying a shock signal comprising one of two simultaneous electrically conductive trace and piezoelectric sensor amplifier circuit signals, according to one embodiment. The method 600 may comprise receiving a shock signal from a piezoelectric sensor (step 602). The method 600 may then comprise Amplifying the received shock signal using a piezoelectric sensor amplifier wherein the using a charge amplifier (step 604). The method 600 may further comprise isolating the power supply of the piezoelectric sensor amplifier using an isolated DC-DC converter (step 606). The method 600 may additionally comprise isolating the output of the piezoelectric sensor amplifier using a high-z buffer (step 608). The method may lastly comprise outputting a piezo sensor output to a data acquisition device (step 610).

Figure 7:
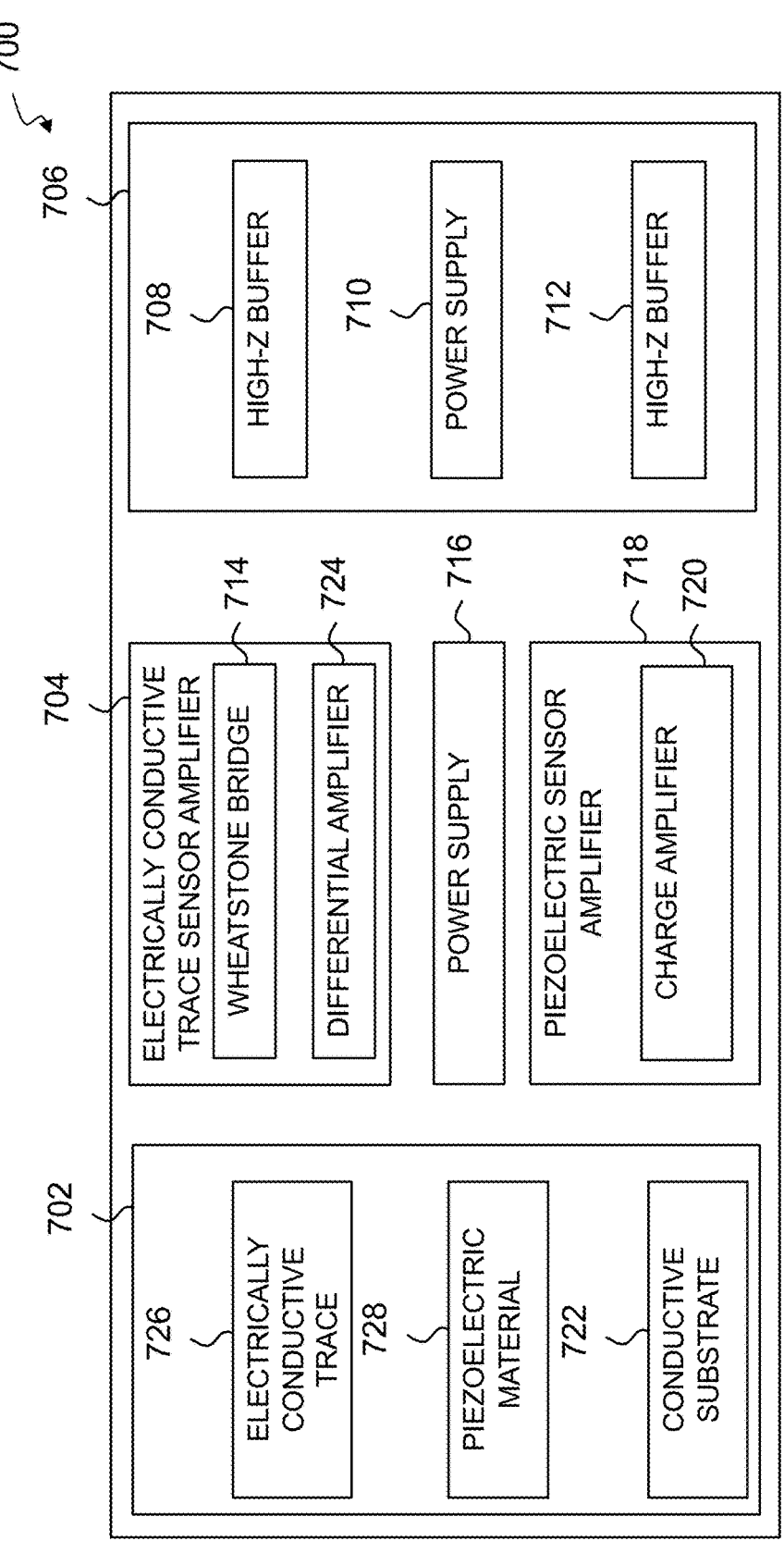
FIG. 7 depicts a high-level block diagram of a simultaneous electrically conductive trace and piezoelectric sensor amplifier circuit for a single element system, according to one embodiment.

FIG. 7 depicts a high-level block diagram of a simultaneous electrically conductive trace and piezoelectric sensor amplifier circuit for a single element system 700, according to one embodiment. The system 700 may comprise: a measurement area 702, where the measurement area 702 comprises: an electrically conductive trace 726, a piezoelectric material 728, and a conductive substrate 722; an electrically conductive trace sensor amplifier 704, where the electrically conductive trace sensor amplifier 704 comprises a Wheatstone bridge 714 and a differential amplifier 724; a power supply 716; a piezoelectric sensor amplifier 718, where the piezoelectric sensor amplifier 718 comprises a charge amplifier 720; and output buffers 706, where the output buffers 706 comprise: high-z buffers 708 and 712, and a power supply 710.

Figures 8A, 8B:
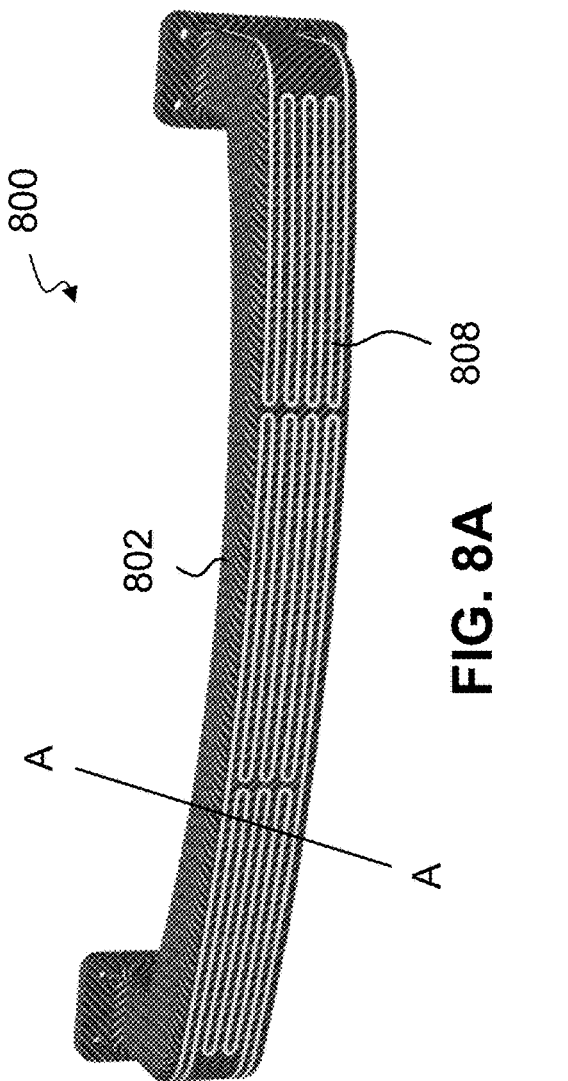
FIG. 8A depicts a perspective view of a sensor system integrated into a composite vehicle bumper beam made of a carbon fiber shell, according to one embodiment.
FIG. 8B depicts a cross-sectional view of the sensor system of FIG. 8A.

FIG. 8A depicts a perspective view of a sensor system 800 integrated into a composite vehicle bumper beam made of a carbon fiber shell, according to one embodiment.

FIG. 8B depicts a cross-sectional view of the sensor system 800 of FIG. 8A along line A-A. The sensor system 800 may include a carbon fiber shell 802. The carbon fiber shell 802 may surround a core such as a natural fiber composite core 804. At least a portion of an outer surface of the carbon fiber shell 802 may include a piezoelectric layer 806. An electrically conductive trace 808 may be disposed on the piezoelectric layer 806.

Figure 9:
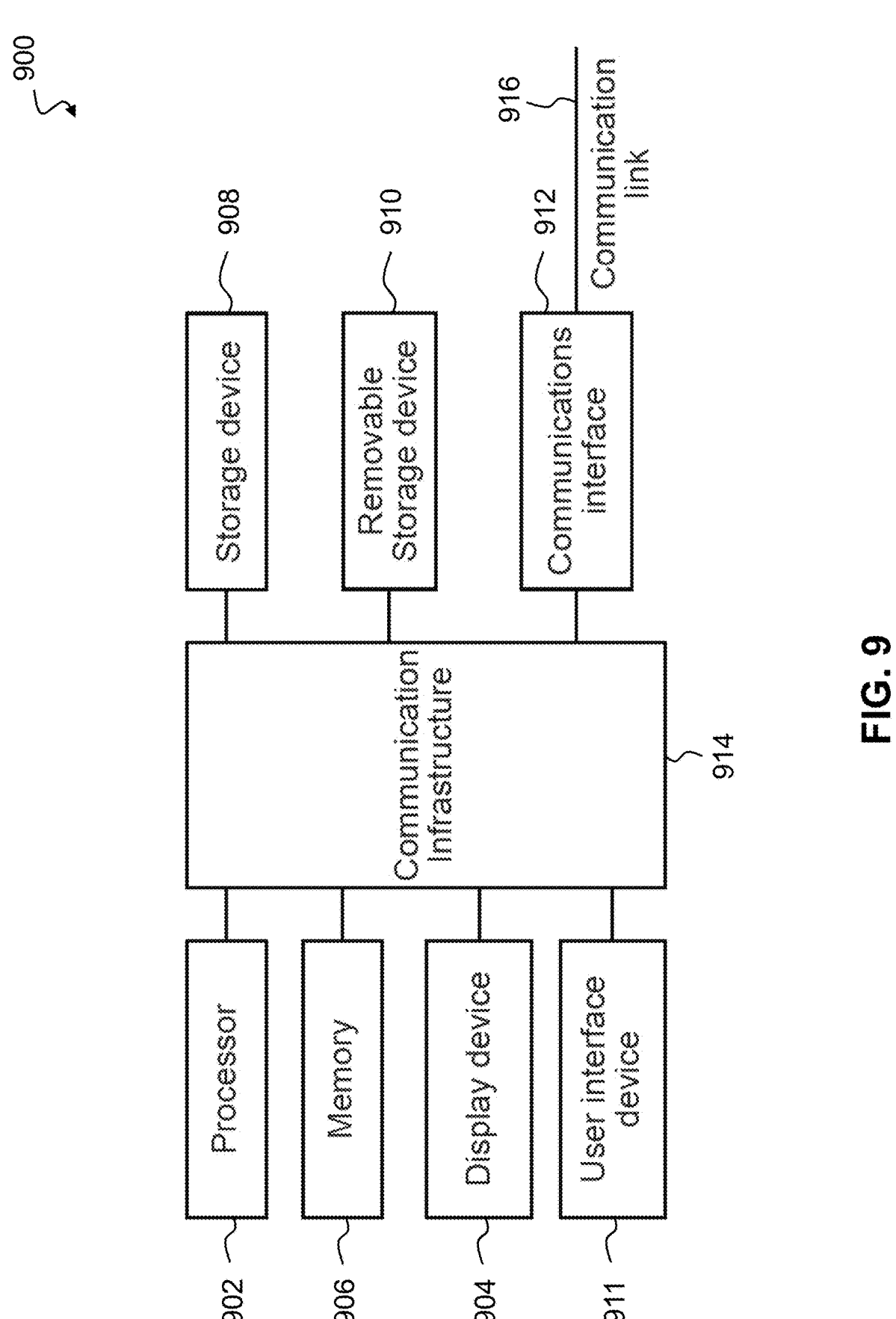
FIG. 9 shows a high-level block diagram and process of a computing system for implementing an embodiment of the system and process.

FIG. 9 is a high-level block diagram 900 showing a computing system comprising a computer system useful for implementing an embodiment of the system and process, disclosed herein. Embodiments of the system may be implemented in different computing environments. The computer system includes one or more processors 902, and can further include an electronic display device 904 (e.g., for displaying graphics, text, and other data), a main memory 906 (e.g., random access memory (RAM)), storage device 908, a removable storage device 910 (e.g., removable storage drive, a removable memory module, a magnetic tape drive, an optical disk drive, a computer readable medium having stored therein computer software and/or data), user interface device 911 (e.g., keyboard, touch screen, keypad, pointing device), and a communication interface 912 (e.g., modem, a network interface (such as an Ethernet card), a communications port, or a PCMCIA slot and card). The communication interface 912 allows software and data to be transferred between the computer system and external devices. The system further includes a communications infrastructure 914 (e.g., a communications bus, cross-over bar, or network) to which the aforementioned devices/modules are connected as shown.

Information transferred via communications interface 914 may be in the form of signals such as electronic, electromagnetic, optical, or other signals capable of being received by communications interface 914, via a communication link 916 that carries signals and may be implemented using wire or cable, fiber optics, a phone line, a cellular/mobile phone link, an radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process.

Embodiments have been described with reference to flowchart illustrations and/or block diagrams of methods, apparatus (systems) and computer program products according to embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing embodiments. In alternative implementations, the functions noted in the blocks may occur out of the order noted in the figures, concurrently, etc.

Computer programs (i.e., computer control logic) are stored in main memory and/or secondary memory. Computer programs may also be received via a communications interface 912. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system.

Figure 10:
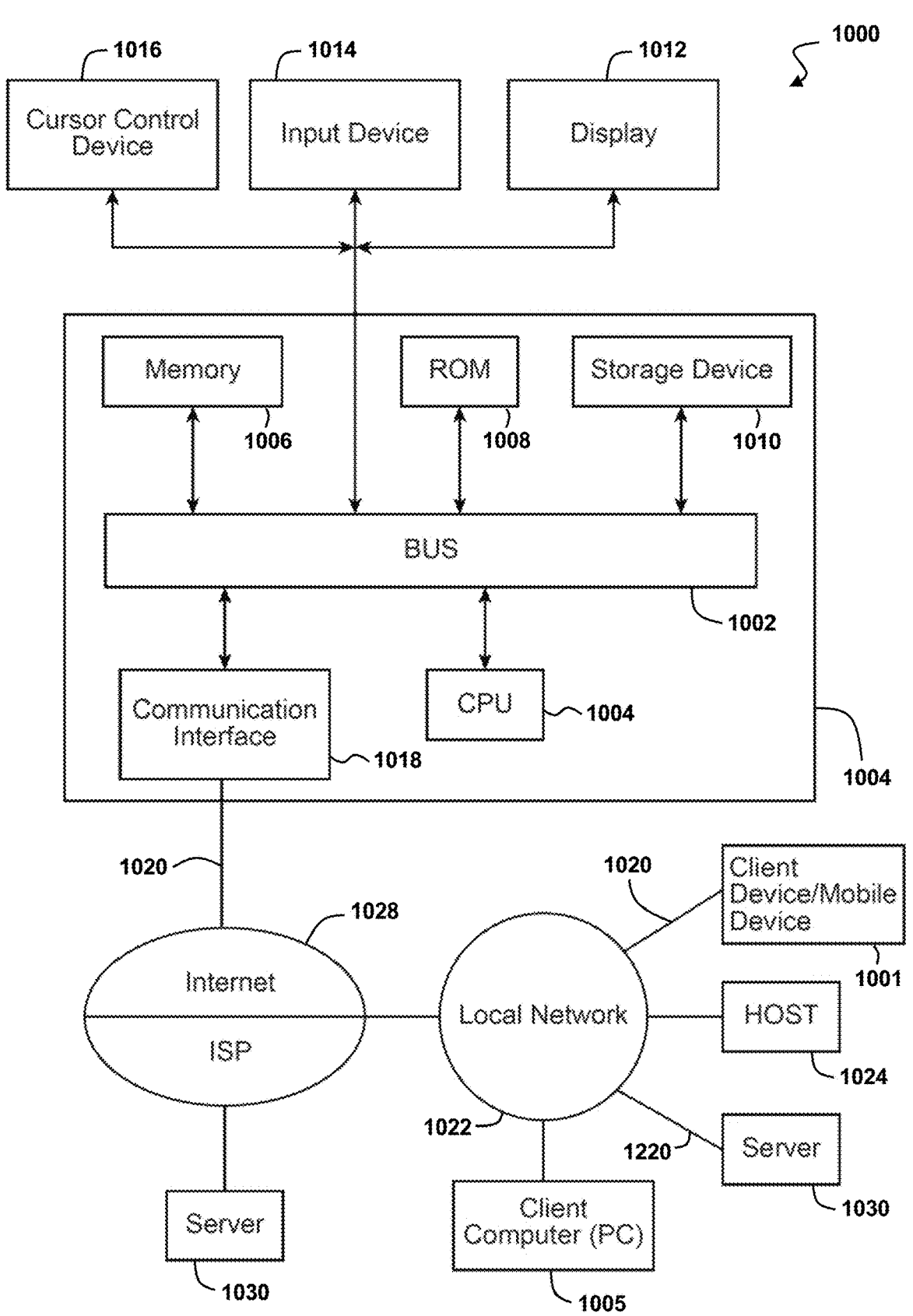
FIG. 10 shows a block diagram and process of an exemplary system in which an embodiment may be implemented.

FIG. 10 shows a block diagram of an example system 1000 in which an embodiment may be implemented. The system 1000 includes one or more client devices 1001 such as consumer electronics devices, connected to one or more server computing systems 1030. A server 1030 includes a bus 1002 or other communication mechanism for communicating information, and a processor (CPU) 1004 coupled with the bus 1002 for processing information. The server 1030 also includes a main memory 1006, such as a random-access memory (RAM) or other dynamic storage device, coupled to the bus 1002 for storing information and instructions to be executed by the processor 1004. The main memory 1006 also may be used for storing temporary variables or other intermediate information during execution or instructions to be executed by the processor 1004. The server computer system 1030 further includes a read only memory (ROM) 1008 or other static storage device coupled to the bus 1002 for storing static information and instructions for the processor 1004. A storage device 1010, such as a magnetic disk or optical disk, is provided and coupled to the bus 1002 for storing information and instructions. The bus 1002 may contain, for example, thirty-two address lines for addressing video memory or main memory 1006. The bus 1002 can also include, for example, a 32-bit data bus for transferring data between and among the components, such as the CPU 1004, the main memory 1006, video memory and the storage 1010. Alternatively, multiplex data/address lines may be used instead of separate data and address lines.

The server 1030 may be coupled via the bus 1002 to a display 1012 for displaying information to a computer user. An input device 1014, including alphanumeric and other keys, is coupled to the bus 1002 for communicating information and command selections to the processor 1004. Another type or user input device comprises cursor control 1016, such as a mouse, a trackball, or cursor direction keys for communicating direction information and command selections to the processor 1004 and for controlling cursor movement on the display 1012.

According to one embodiment, the functions are performed by the processor 1004 executing one or more sequences of one or more instructions contained in the main memory 1006. Such instructions may be read into the main memory 1006 from another computer-readable medium, such as the storage device 1010. Execution of the sequences of instructions contained in the main memory 1006 causes the processor 1004 to perform the process steps described herein. One or more processors in a multi-processing arrangement may also be employed to execute the sequences of instructions contained in the main memory 1006. In alternative embodiments, hard-wired circuitry may be used in place of or in combination with software instructions to implement the embodiments. Thus, embodiments are not limited to any specific combination of hardware circuitry and software.

The terms "computer program medium," "computer usable medium," "computer readable medium", and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor multi-core processor to perform the features of the computer system. Accordingly, such computer programs represent controllers of the computer system.

Generally, the term "computer-readable medium" as used herein refers to any medium that participated in providing instructions to the processor 1004 for execution. Such a medium may take many forms, including but not limited to, non-volatile media, volatile media, and transmission media. Non-volatile media includes, for example, optical or magnetic disks, such as the storage device 1010. Volatile media includes dynamic memory, such as the main memory 1006. Transmission media includes coaxial cables, copper wire and fiber optics, including the wires that comprise the bus 1002. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

Various forms of computer readable media may be involved in carrying one or more sequences of one or more instructions to the processor 1004 for execution. For example, the instructions may initially be carried on a magnetic disk of a remote computer. The remote computer can load the instructions into its dynamic memory and send the instructions over a telephone line using a modem. A modem local to the server 1030 can receive the data on the telephone line and use an infrared transmitter to convert the data to an infrared signal. An infrared detector coupled to the bus 1002 can receive the data carried in the infrared signal and place the data on the bus 1002. The bus 1002 carries the data to the main memory 1006, from which the processor 1004 retrieves and executes the instructions. The instructions received from the main memory 1006 may optionally be stored on the storage device 1010 either before or after execution by the processor 1004.

The server 1030 also includes a communication interface 1018 coupled to the bus 1002. The communication interface 1018 provides a two-way data communication coupling to a network link 1020 that is connected to the worldwide packet data communication network now commonly referred to as the Internet 1028. The Internet 1028 uses electrical, electromagnetic or optical signals that carry digital data streams. The signals through the various networks and the signals on the network link 1020 and through the communication interface 1018, which carry the digital data to and from the server 1030, are exemplary forms or carrier waves transporting the information.

In another embodiment of the server 1030, interface 1018 is connected to a network 1022 via a communication link 1020. For example, the communication interface 1018 may be an integrated services digital network (ISDN) card or a modem to provide a data communication connection to a corresponding type of telephone line, which can comprise part of the network link 1020. As another example, the communication interface 1018 may be a local area network (LAN) card to provide a data communication connection to a compatible LAN. Wireless links may also be implemented. In any such implementation, the communication interface 1018 sends and receives electrical electromagnetic or optical signals that carry digital data streams representing various types of information.

The network link 1020 typically provides data communication through one or more networks to other data devices. For example, the network link 1020 may provide a connection through the local network 1022 to a host computer 1024 or to data equipment operated by an Internet Service Provider (ISP). The ISP in turn provides data communication services through the Internet 1028. The local network 1022 and the Internet 1028 both use electrical, electromagnetic or optical signals that carry digital data streams. The signals through the various networks and the signals on the network link 1020 and through the communication interface 1018, which carry the digital data to and from the server 1030, are exemplary forms or carrier waves transporting the information.

The server 1030 can send/receive messages and data, including e-mail, program code, through the network, the network link 1020 and the communication interface 1018. Further, the communication interface 1018 can comprise a USB/Tuner and the network link 1020 may be an antenna or cable for connecting the server 1030 to a cable provider, satellite provider or other terrestrial transmission system for receiving messages, data and program code from another source.

The example versions of the embodiments described herein may be implemented as logical operations in a distributed processing system such as the system 1000 including the servers 1030. The logical operations of the embodiments may be implemented as a sequence of steps executing in the server 1030, and as interconnected machine modules within the system 1000. The implementation is a matter of choice and can depend on performance of the system 1000 implementing the embodiments. As such, the logical operations constituting said example versions of the embodiments are referred to for e.g., as operations, steps or modules.

Similar to a server 1030 described above, a client device 1001 can include a processor, memory, storage device, display, input device and communication interface (e.g., e-mail interface) for connecting the client device to the Internet 1028, the ISP, or LAN 1022, for communication with the servers 1030.

The system 1000 can further include computers (e.g., personal computers, computing nodes) 1005 operating in the same manner as client devices 1001, wherein a user can utilize one or more computers 1005 to manage data in the server 1030.

Figure 11:
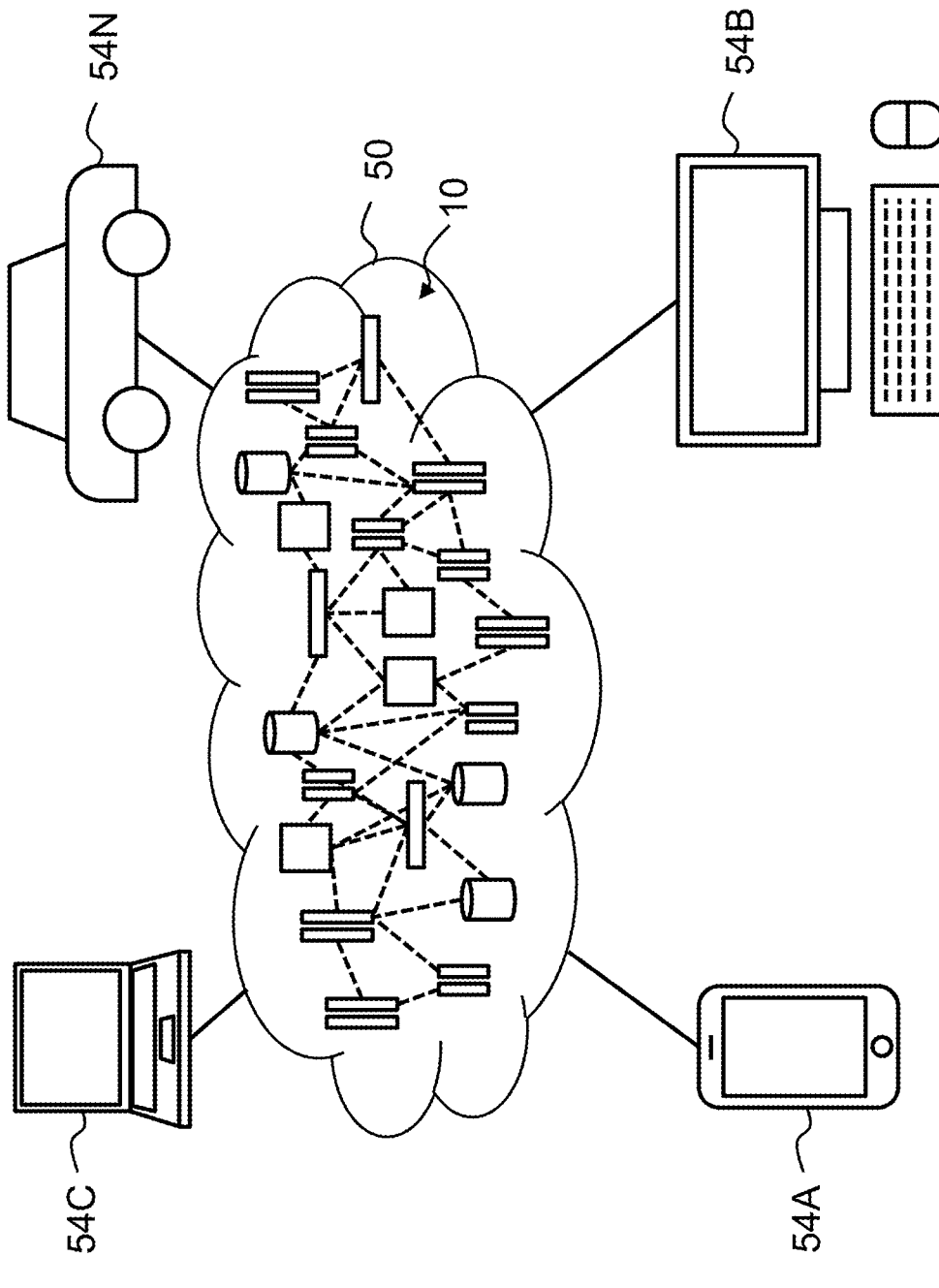
FIG. 11 depicts a cloud computing environment for implementing an embodiment of the system and process disclosed herein.

Referring now to FIG. 11, illustrative cloud computing environment 50 is depicted. As shown, cloud computing environment 50 comprises one or more cloud computing nodes 10 with which local computing devices used by cloud consumers, such as, for example, personal digital assistant (PDA), smartphone, smart watch, set-top box, video game system, tablet, mobile computing device, or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 11 are intended to be illustrative only and that computing nodes 10 and cloud computing environment 50 can communicate with any type of computerized device over any type of network and/or network addressable connection (e.g., using a web browser).

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention herein disclosed by way of examples should not be limited by the particular disclosed embodiments described above.

What is claimed is:

1. A dual-sensor apparatus (101), comprising:

a conductive substrate (124);

a piezoelectric material (126) disposed on the conductive substrate (124); and an electrically conductive trace (102) disposed on the piezoelectric material (126) in a strain gauge pattern, wherein the electrically conductive trace (102) comprises two leads;

wherein the conductive substrate (124) and the electrically conductive trace (102) serve as electrodes for the piezoelectric material (126) to form a piezoelectric sensor; and wherein the electrically conductive trace (102) serves as a strain sensor.

2. The dual-sensor apparatus (101) of claim 1, wherein the dual-sensor apparatus (101) is attached to a structural surface for structural damage detection and health monitoring.

3. The dual-sensor apparatus (101) of claim 1, further comprising:

an electrically conductive trance sensor amplifier (104);

an electrically conductive trace current loop (128) formed between the electrically conductive trace (102) and the conductive trance sensor amplifier (104) through the two leads of the electrically conductive trace (102);

a charge amplifier (136); and a piezoelectric current loop (146) formed between the sensor apparatus (101) and a sensor amplifier (144) through two connections between the electrically conductive trace (102) and the electrically conductive trace sensor amplifier (104), and between the conductive substrate (124) and the charge amplifier (136).

4. The dual-sensor apparatus (101) of claim 3, wherein the piezoelectric current loop (146), the connection between the conductive substrate (124), and the charge amplifier (136) are connected to a ground (122).

5. The dual-sensor apparatus (101) of claim 4, wherein the conductive trance sensor amplifier (104) is configured to measure a strain on a surface connected to the conductive substrate (124) using the electrically conductive trace current loop (128) generated by a resistance change of the electrically conductive trace (102).

6. The dual-sensor apparatus (101) of claim 5, wherein the charge amplifier (136) is configured to measure an impact shock on a surface connected to the conductive substrate (124) using the piezoelectric current loop (146) generated by the piezoelectric material (126).

7. The dual-sensor apparatus (101) of claim 6, further comprising:

a high input impedance buffer (138) connected to the conductive trance sensor amplifier (104); and a high input impedance buffer (142) connected to the piezoelectric sensor amplifier (104).

8. The dual-sensor apparatus (101) of claim 7, wherein the high input impedance buffer (138) is configured to isolate an output of the conductive trance sensor amplifier (104) to prevent a current flow (120) to the ground (122).

9. The dual-sensor apparatus (101) of claim 8, wherein the high input impedance buffer (142) is configured to isolate an output of the piezoelectric sensor amplifier (118) to prevent the current flow (120) to the ground (122).

10. The dual-sensor apparatus (101) of claim 1, wherein said conductive substrate (124) is the surface of the structure to be monitored.

11. A segmented dual-sensor apparatus (201), comprising:

a conductive substrate (232);

a piezoelectric material (234) disposed on the conductive substrate (232); and a plurality of electrically conductive traces (202, 204) disposed on portions of the piezoelectric material (234) in respective strain gauge patterns, wherein each electrically conductive trace (202, 204) comprises two leads;

wherein the conductive substrate (232) and the plurality of electrically conductive traces (202, 204) serve as electrodes for the piezoelectric material (234) to form a plurality of piezoelectric sensors; and wherein the plurality of electrically conductive traces (202, 204) serve as a plurality of strain sensors.

12. The segmented dual-sensor apparatus (201) of claim 11, wherein the segmented dual-sensor apparatus (201) is attached to a structural surface for structural damage detection, damage location identification, and structural health monitoring.

13. The segmented dual-sensor apparatus (201) of claim 11, further comprising:

a plurality of conductive trance sensor amplifiers (226, 228);

a plurality of electrically conductive trace current loops (230, 238) formed between the sensor apparatus (201) and a respective sensor amplifier of the plurality of sensor amplifiers (226, 228) through the respective two leads of each electrically conductive trace (202, 204); and a plurality of piezoelectric current loops (236, 237) formed between the sensor apparatus (201) and a respective sensor amplifier (226, 228) of the plurality of sensor amplifiers (226, 228) through the respective two leads of each electrically conductive trace (202, 204) and the conductive substrate (232).

14. The segmented dual-sensor apparatus (201) of claim 13, wherein the plurality of the piezoelectric current loops (236, 237), the connection between the conductive substrate (232), and a respective sensor amplifier (226, 228) of the plurality of sensor amplifiers (226, 228) are connected to a ground (206).

15. The segmented dual-sensor apparatus (201) of claim 14, wherein the plurality of sensor amplifiers (226, 228) are configured to measure a strain on portions of a surface connected to the conductive substrate (232) using a respective conductive current loop (230, 238) of the plurality of the electrically conductive trace current loops (230, 238).

16. The segmented dual-sensor apparatus (201) of claim 15, wherein the plurality of sensor amplifiers (226, 228) are configured to measure an impact shock on portions of a surface connected to the conductive substrate (232) using a respective piezoelectric current loop (236, 237) of the plurality of the piezoelectric current loops (236, 237).

17. The segmented dual-sensor apparatus (201) of claim 16, further comprising:

a plurality of output buffers (224, 214) connected to a respective sensor amplifier (226, 228) of the plurality of sensor amplifiers (226, 228).

18. The segmented dual-sensor apparatus (201) of claim 17, wherein the plurality of output buffers (224, 214) is configured to isolate a plurality of outputs of the sensor amplifiers (224, 214) to prevent the current flow (205) to the ground (206).

19. The segmented dual-sensor apparatus (201) of claim 11, wherein said conductive substrate (232) is the surface of the structure to be monitored.

20. A method comprising:

providing a conductive substrate (124);

disposing a piezoelectric material (126) on the conductive substrate (124); and disposing an electrically conductive trace (102) on the piezoelectric material (126) in a strain gauge pattern, wherein the electrically conductive trace (102) comprises two leads;

forming a piezoelectric sensor from the conductive substrate (124) and the electrically conductive trace (102), wherein the conductive substrate (124) and the electrically conductive trace (102) serve as electrodes for the piezoelectric material (126); and forming a strain sensor from the electrically conductive trace (102).

* * * * *